United States Patent

Kristiansson et al.

[11] Patent Number: 5,378,977
[45] Date of Patent: Jan. 3, 1995

[54] DEVICE FOR MAKING CURRENT MEASUREMENTS USED IN DETERMINING THE CHARGING OF A VEHICLE STORAGE BATTERY

[75] Inventors: Urban Kristiansson, Göteborg; Robert Eriksson, Kungälv, both of Sweden

[73] Assignee: AB Volvo, Sweden

[21] Appl. No.: 941,076

[22] PCT Filed: Mar. 27, 1991

[86] PCT No.: PCT/SE91/00231
§ 371 Date: Oct. 15, 1992
§ 102(e) Date: Oct. 15, 1992

[87] PCT Pub. No.: WO91/14600
PCT Pub. Date: Oct. 3, 1991

[30] Foreign Application Priority Data

Mar. 29, 1990 [SE] Sweden ................................. 9001143

[51] Int. Cl.6 .................................................. H02J 7/04
[52] U.S. Cl. .......................................... 320/44; 320/48
[58] Field of Search .................... 320/2, 43, 44, 48

[56] References Cited

U.S. PATENT DOCUMENTS

| | | | |
|---|---|---|---|
| 3,787,754 | 1/1974 | Seabase | 320/43 |
| 3,808,487 | 4/1974 | Feuillaae | 320/43 X |
| 4,163,186 | 7/1979 | Haley | 320/48 |
| 4,387,334 | 6/1983 | Loper | 320/44 |
| 4,692,680 | 9/1987 | Snerer | 320/2 |
| 4,775,827 | 10/1988 | Ijntema et al. | 320/44 |
| 5,043,651 | 8/1991 | Tamura | 320/43 |
| 5,144,218 | 9/1992 | Bosscha | 320/44 |
| 5,193,067 | 3/1993 | Sato et al. | 320/43 X |

FOREIGN PATENT DOCUMENTS

| | | | |
|---|---|---|---|
| 526410 | 9/1972 | Germany . | |
| 56-01469 | 1/1981 | Japan | 320/43 |

Primary Examiner—Kristine L. Peckman
Attorney, Agent, or Firm—Lerner, David, Littenberg, Krumholz & Mentlik

[57] ABSTRACT

A device for making current measurements used in determining the charging status of a vehicle storage battery, comprising a ground conductor connected between one pole of the storage battery and the ground contact. The pole is connected via electrical conductors to a sensor having a source of electric power for providing at least one electric current to the ground connector. Values which are deducted from the current flowing through the ground conductor are provided to a microprocessor to determine the charging status of the battery.

2 Claims, 1 Drawing Sheet

DEVICE FOR MAKING CURRENT MEASUREMENTS USED IN DETERMINING THE CHARGING OF A VEHICLE STORAGE BATTERY

FIELD OF THE INVENTION

The present invention relates to a device for determining the charging status of a vehicle storage battery, comprising a ground connector connected between one pole of the storage battery and a ground contact, and which is further connected to sensor means for sensing the flow of current.

BACKGROUND OF THE INVENTION

There is a demand for the ability to monitor the charging status in the storage battery of a vehicle. After a number of cold starts, trips with small mileage or with use of energy demanding extra equipment in the vehicle, there is a risk that the effective output of the generator will no longer be sufficient to drive all equipment and simultaneously give enough energy for recharging the storage battery. Furthermore, an accumulator battery is successively aged, which means that over time it takes a longer time to recharge it and the total accumulator capacity is reduced. Power dissipation may also occur in the generator or other parts of the electrical system so that the output of the generator is reduced or a voltage drop occurs.

Having access to information about the charging status of the battery, the driver of the vehicle can be in a better position to avoid starting problems, e.g. by changing an old battery, by adjustment of the power consumption so that the battery receives proper charging or by additional recharging of a temporarily run-down battery.

Known means for determining the charging of a battery does not consider the age of the battery, and typically use rather deliberate and expensive sensor means for detection.

SUMMARY OF THE INVENTION

One object of the present invention is therefore to provide a simple and efficient sensor which can be used for determining the charging status of a storage battery.

This object is achieved according to the invention in that the sensor means comprises a source of electric power for providing at least one electric current through a ground connector, at least one current measuring unit, and means for processing electrical signals, wherein values which are deducted from the current flowing through the ground connector are provided to the processing means and are used for determining the charging status of the storage battery.

According to a preferred embodiment of the present invention, the ground connector is connected to the battery pole and body or the chassis of the vehicle, and the ground connector and the electrical conductors which connect the ground connector to the sensor means may form a common cabling. Thus, the sensor will be simple to integrate in the wiring system of a vehicle.

Preferably, the cabling comprises an uninsulated cabling ground braid with a cable shoe or connector in each of its ends and two insulated conductors, one end of which is connected to the respective cable connector and wherein the other ends are connected to the sensor means.

DETAILED DESCRIPTION OF THE PREFERRED EMBODIMENT

Figure 1:
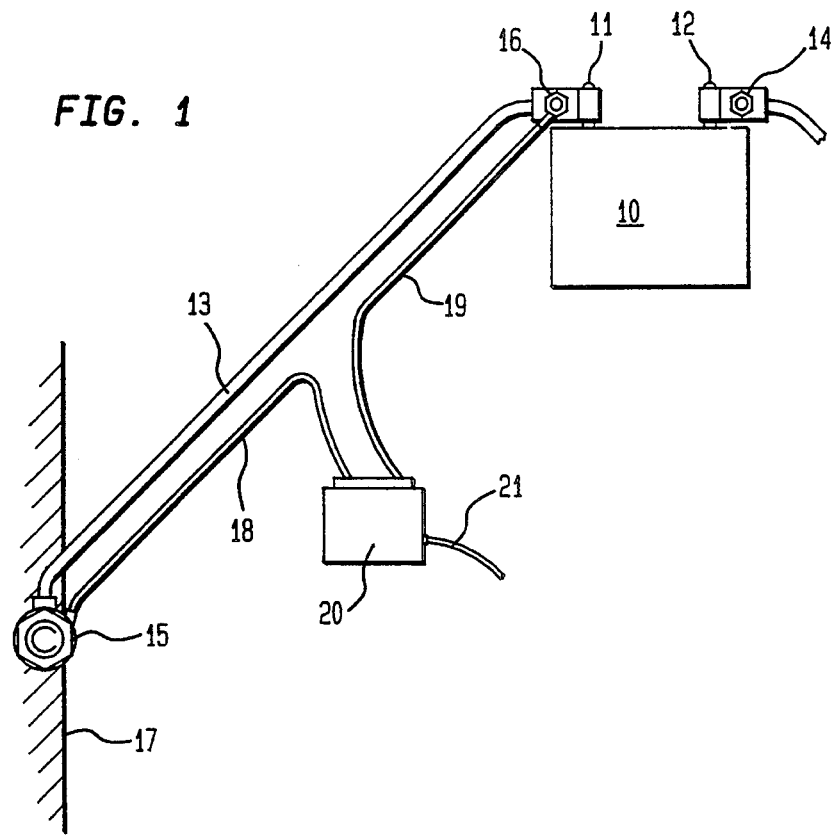
FIG. 1 shows the basic construction of the device for determining the charging status of a storage battery diagrammatically showing the storage battery connected to a vehicle according to the invention.
Figure 2:
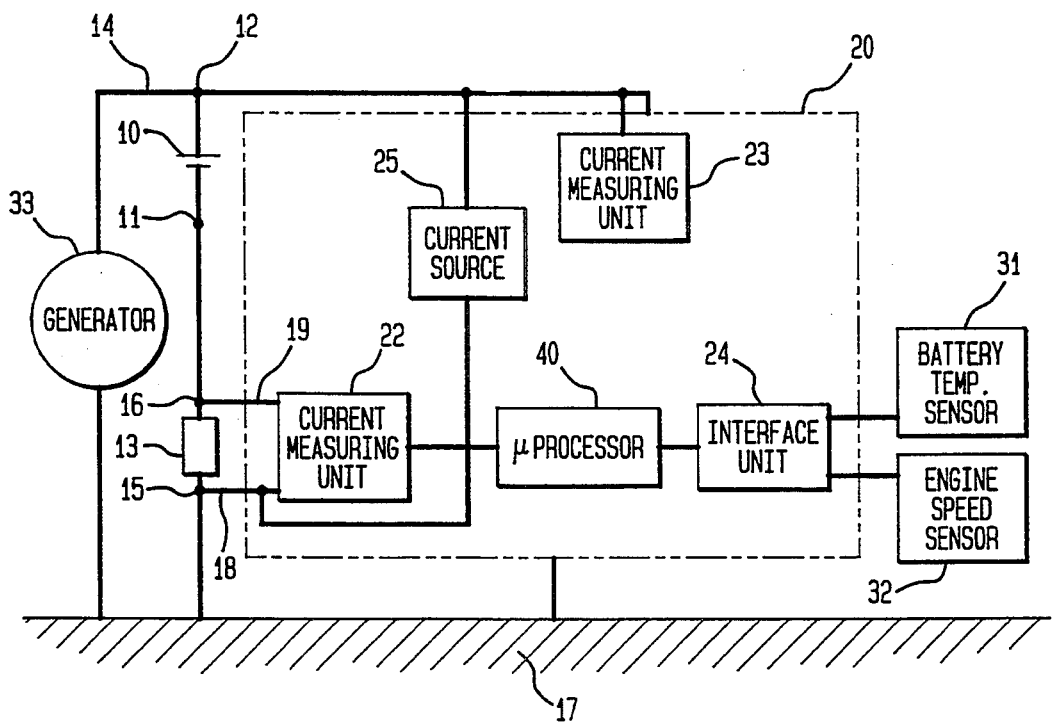
FIG. 2 is a block circuit diagram showing the measurement system in which the present invention is used.

Referring to FIGS. 1 and 2, reference 10 generally designates a storage battery conventionally connected with both its poles 11 and 12 to the wiring system of a vehicle via a ground connector 13 and a current connector 14. Each end of the ground connector 13 is provided with a cable connector 15 and 16 respectively and is mounted with a metallic connection by screws to the vehicle body 17 and cable connector 16 so that it can be used as a return conductor to the battery by the generator 33 and the power consumers in the wiring system, e.g., outer and inner lighting, air-conditioning, radio and so on.

The storage battery 10 is used conventionally, to deliver energy to a starter motor for starting a combustion engine and to provide a storage means for the energy consumption when the output of the generator alone is not sufficient for balancing the energy consumption in the electrical system of the vehicle. The battery 10 is recharged for as long as the voltage is lower in the battery than in the electrical system.

The battery status, i.e. the amount of charge, depends upon several different parameters, such as the discharging current and the pole tension, temperature, capacity and age of the battery. Information of these parameters can, according to the present invention, be obtained by means of a sensor or measuring shunt comprising ground connector 13 which is mounted between body 17 and the battery pole 11. Ground connector 13 can, without any special efforts, be devised in such way that it presents a suitable resistance, for example 1 m$\Omega$. This resistance can be utilized for measuring the battery current and the tension over the two shunt points 15 and 16.

For this purpose, insulated electrical conductors 18 and 19 have been connected to each of the cable connectors 15 and 16. Electrical conductors 18 and 19 connect both cable connectors to 15 and 16 to a central unit 20, preferably comprising a micro processor 40, current measuring units 22 and 23, a source of constant current 25 for production of at least one current, and an interface unit 24 for adapting the input signals from battery temperature sensor 31 and engine speed sensor 32.

The resistance in ground connector 13 depends, for example, upon oxidation on the metallic connections of shunt points 15 and 16, body 17 and battery pole 11. Therefore, central unit 20 must be updated within certain intervals regarding this parameter, as well as in regard to other parameters concerning battery and engine temperature. To this end, current source 25 is used and voltage across ground connector 13 is measured to determine the resistance in ground connector 13 during a measuring sequence. The charging status of battery 10 is determined by known methods such as the method disclosed in Swedish Patent No. 9001137-0. In this regard, the system is either in a state of rest or in an active state. When the system is in its active state, the battery current flowing through the ground connector is measured during a certain time period. From these measurements, a value of the available quantity of charge is derived by "counting" the amperehours into and out of the battery respectively. This value is compared with the quantity of charge of a fully charged battery, giving a value of the charging status q of the battery. The value of q is represented as a percentage, as compared to a fully charged battery. There is also compensation for a conversion efficiency in connection with the charging and discharging of the battery at different values of the temperature and charging status of the battery. The value of the charging status q may be utilized for shutting down a certain electrical load when the charging status is low, for example, or for indicating to the driver that the charging status is low.

A presentation unit (not shown) is connected to central unit 20 via a wiring 21 and is placed at the instrument panel of the vehicle, so that the charging status of battery 10 can be displayed to the driver. The presentation unit can comprise any type of conventional display means like a pointer, a warning light or similar types of indicator instruments within the field.

The sensor according to the invention can be applied together with the central unit and presentation unit to various types of vehicles, for example passenger cars and lorries, motorcycles and leisure boats.

The invention is not limited to the above described embodiment example and more variations are possible within the scope of the following claims. For example, the connector 13 may compose an uninsulated braided ground cable or alternatively some form of insulated conductor. Furthermore, any kind of conductor which connects the car body and the battery pole can be used.

We claim:

1. A device for making current measurements used in determining a charging status of a storage battery of a vehicle having a pair of poles, comprising a ground connector electrically connected between one of the pair of poles and a chassis of the vehicle via a ground contact, sensor means for sensing a flow of current, and first and second electrical conductors electrically connecting said ground connector to said sensor means to form a common cabling, said sensor means comprising a source of electrical power for providing an electric current through said ground connector, at least one measuring unit for measuring said current flowing through said ground connector, and processing means for processing electrical signals, wherein values which are deduced from said current flowing through said ground connector revealed by said measuring unit are provided to said processing means for use in determining the charging status of the storage battery.

2. A device as claimed in claim 1, wherein said common cabling comprises an uninsulated ground braid having a cable connector at each end of said braid, and one end of each of said first and second electrical conductors being connected respectively to each said cable connector and the other end of each of said first and second electrical conductors being connected to said sensor means.

* * * * *

UNITED STATES PATENT AND TRADEMARK OFFICE
CERTIFICATE OF CORRECTION

PATENT NO. : 5,378,977
DATED : January 3, 1995
INVENTOR(S) : Urban Kristiansson, et al.

It is certified that error appears in the above-indentified patent and that said Letters Patent is hereby corrected as shown below:

Cover page, under ABSTRACT, line 3, "conductor" should read --connector--.

Cover page, under ABSTRACT, line 9, "conductor" should read --connector--.

Signed and Sealed this

Eighteenth Day of April, 1995

Attest:

BRUCE LEHMAN

*Attesting Officer*

*Commissioner of Patents and Trademarks*